United States Patent [19]

Metz

[11] Patent Number: 4,484,147

[45] Date of Patent: Nov. 20, 1984

[54] BOOTSTRAPPED SHUNT FEEDBACK AMPLIFIER

[75] Inventor: Arthur J. Metz, Gervais, Oreg.

[73] Assignee: Tektronix, Inc., Beaverton, Oreg.

[21] Appl. No.: 481,024

[22] Filed: Mar. 31, 1983

[51] Int. Cl.³ ............................................. H03F 3/04
[52] U.S. Cl. ................................. 330/156; 330/291; 330/311; 330/296
[58] Field of Search .................. 330/76, 156, 288, 291, 330/292, 293, 294, 296, 311, 70, 71; 328/176

[56] References Cited

U.S. PATENT DOCUMENTS 3,223,938 12/1965 Brook .................................. 330/156

FOREIGN PATENT DOCUMENTS 817717 8/1959 United Kingdom .................. 330/70

Primary Examiner—James B. Mullins
Assistant Examiner—Steven J. Mottola
Attorney, Agent, or Firm—George T. Noe

[57] ABSTRACT

An improved bootstrapped shunt feedback amplifier is provided in which a minimum number of transistors are arranged to provide a higher slew rate of output voltage at lower power, while minimizing distortion and thus providing a more precise signal replication. Features include the use of three-terminal composite transistors to increase bandwidth and bootstrapping to improve amplifier response while reducing voltage stress on the active devices.

5 Claims, 2 Drawing Figures 4,484,147

BOOTSTRAPPED SHUNT FEEDBACK AMPLIFIER

BACKGROUND OF THE INVENTION

The present invention relates generally to shunt feedback amplifiers, and in particular to an improved bootstrapped shunt feedback amplifier.

U.S. Pat. No. 3,868,580 describes a bootstrapped shunt feedback amplifier having the capability of providing large, fast voltage changes efficiently and accurately while driving capacitive loads. The amplifier is designed so that an input signal drives a common-emitter transistor stage, and the output is connected between the collector of the common-emitter stage and a bootstrapped emitter follower output stage. This arrangement permits the amplifier to supply large load currents of either polarity, and a current-steering circuit permits the output voltage to slew through its dynamic range without any dead zones due to transistors switching on and off, so as to preclude distortion of the output waveform. To accomodate large voltage swings, this prior art amplifier was expanded by stacking additional transistors in totem-pole fashion both for the shunt feedback amplifier lower portion and for the emitter follower upper portion thereby to eliminate high-voltage stress on any of the active devices within the amplifier. A decided disadvantage in this amplifier design is that many transistors are required to effect proper operation without stressing the shunt feedback amplifier transistors, and, moreover, as transistors are added, precise control over the output voltage is somewhat diminished. Particularly in oscilloscopes, a precise replication of signals over large voltage swings is required to accurately drive the deflection plates.

SUMMARY OF THE INVENTION

In accordance with the present invention, an improved bootstrapped shunt feedback amplifier is provided in which a minimum number of transistors are arranged to allow reduced power consumption and provide a faster response, a higher slew rate of the output voltage, and a more accurate gain, which results in more precise signal replication. The preferred embodiment of the improved amplifier design of the present invention uses a pair of three-terminal composite transistors, each having a current gain which is approximately double that of a single transistor. One of these three-terminal composite transistors is used as the grounded-emitter control stage of the shunt feedback amplifier, and the other is used as an emitter follower and pull-up current path. Additionally, the use of these devices provides a higher open loop gain. A feature of this amplifier design is a transistor biasing scheme which minimizes parasitic capacitance inherent in the active devices. A transistor operated as a common base amplifier stage is interposed between the grounded-emitter stage and the output terminal to reduce the Miller effect of the grounded-emitter control device. A bootstrapping scheme for improving closed loop gain by compensating beta losses of the transistors while reducing voltage stress on the common-base amplifier transistors is also provided.

It is therefore one object of the present invention to provide an improved bootstrapped shunt feedback amplifier capable of providing large, fast voltage changes efficiently and accurately on capacitive loads.

It is another object of the present to provide an improved bootstrapped shunt feedback amplifier of simplified construction and yet increased bandwidth capabilities and accurate gain characteristics.

It is a further object of the present invention to provide an improved bootstrapped shunt feedback amplifier capable of high slew rates between voltage levels while reducing voltage and power stress on the active devices of the circuit, and while consuming little quiescent power.

Other objects, features, and advantages of the present invention will become apparent to those having ordinary skill in the art upon a reading of the following description when taken in conjunction with the drawings.

DETAILED DESCRIPTION OF THE INVENTION

Figure 1:
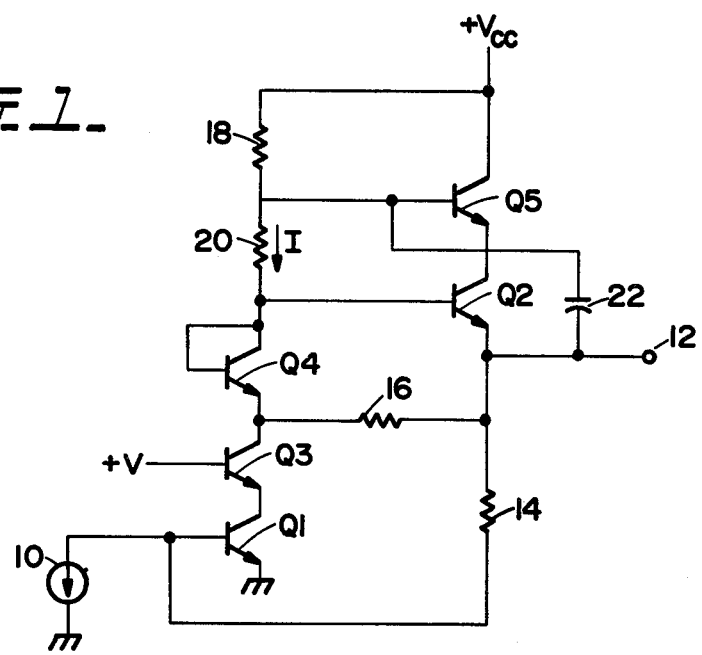
FIG. 1 is a schematic of a basic bootstrapped shunt feedback amplifier circuit in accordance with the present invention.

There is shown in FIG. 1 a bootstrapped shunt feedback amplifier in accordance with the present invention in which an input signal generated by a current generator 10 is to be accurately replicated as a voltage signal at an output terminal 12, which may be connected to a capacitive load such as the deflection plates of a cathode ray tube. The amplifier comprises as basic components a transistor Q1, which is the amplifier control device and pull-down current conduction path for negative-going voltage outputs, a transistor Q2, which is emitter follower and pull-up current conduction path for positive-going voltage outputs, and a feedback resistor 14, which is connected from the emitter of transistor Q2 to the base of transistor Q1. The emitter of transistor Q1 is connected to ground. A transistor Q3, which is operated in a common-base amplifier configuration, is connected to the collector of transistor Q1 to increase the open loop gain of the feedback amplifier and to reduce the Miller effect of transistor Q1. The base of transistor Q3 is connected to a suitable source of bias voltage. A resistor 16 is connected between the emitter of transistor Q2 and the collector of transistor Q3, and a diode-connected transistor Q4 is connected from the base of transistor Q2 to the collector of transistor Q3. Transistor Q4 and resistor 16 provide a biasing network for emitter follower transistor Q2. In the quiescent state, and the positive-going voltage output state, transistor Q4 maintains a constant voltage across resistor 16 so that little, if any, DC current flows through resistor 16. In the quiescent state, no current flows to the load, and all of the standing current for transistor Q2 is provided by feedback resistor 14. For positive-going output voltage swings, emitter follower transistor Q2 furnishes all of the current demanded by the load. For negative-going output voltage swings, resistor 16 becomes part of the pull-down current conduction path, developing a voltage thereacross which reverse biases transistor Q2 so that all of the current drawn from the load flows through transistors Q3 and Q1 to ground.

A bootstrap network comprising a transistor Q5, its associated biasing resistors 18 and 20, and a capacitor 22 is provided to drive the emitter follower stage and at the same time to reduce the voltage stress on transistor Q2 and to reduce the effects of the collector-to-base capacitance of transistor Q2. Resistors 18 and 20 are serially connected between a suitable source of positive voltage $+V_{cc}$ and the collector (and base) of diode-connected transistor Q4. The base of transistor Q5 is connected to the junction of resistors 18 and 20, the collector thereof is connected to the positive voltage supply $+V_{cc}$, and the emitter thereof is connected to the collector of transistor Q2. Bootstrap capacitor 22, which may suitably be of a comparatively large value, is connected between the base of transistor Q5 and the emitter of transistor Q2. The term bootstrapping in this particular application refers to the technique in which the voltage across transistor Q2 is maintained substantially constant under dynamic operating conditions. In other words the voltage signal which is developed at output terminal 12 is transmitted via capacitor 22 to the base of transistor Q5, and hence, to the collector of transistor Q2. Since the voltage across resistor 20 remains substantially constant, it appears under dynamic operating conditions as a constant current source, and the bootstrapped voltage is applied to the base of emitter follower transistor Q2. Moreover, transistor Q4 maintains zero volts across resistor 16 on positive-going voltage swings, so that signal drive is provided via transistor Q4 to the base of transistor Q2 as well.

Figure 2:
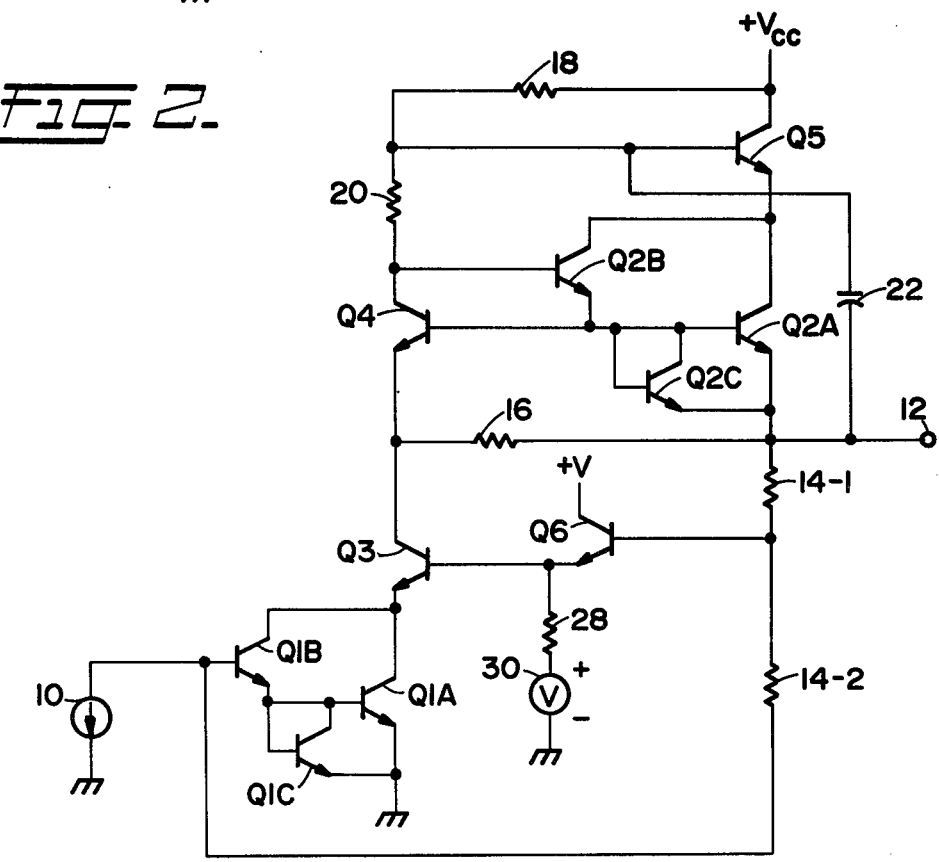
FIG. 2 is a detailed schematic of the preferred embodiment.

The amplifier of FIG. 2 is an improved version of the amplifier of FIG. 1, and is the preferred embodiment of the present invention. Appropriate FIG. 1 reference numerals are retained for simplicity of description. Transistors Q1 and Q2 are replaced by three-terminal composite transistors which each have a current gain approximately double that of a single transistor. Three-terminal composite transistors of this type are taught in U.S. Pat. No. 4,236,119. Transistors Q1A-Q1B-Q1C and Q2A-Q2B-Q2C provide improved speed characteristics to increase the slew rate of the output voltage and also provide a higher open loop gain. Moreover, these composite transistors require little bias current, so input signal requirements may be reduced. It is to be noted that transistor Q4 has its base connected to the emitter of Q2B while the collector thereof is connected to the base of transistor Q2B. The addition of transistor Q2B requires the biasing effect of transistor Q4 to be doubled if the voltage across resistor 16 is to be maintained at zero voltage under the conditions described earlier. Changing transistor Q4 from a diode to the configuration shown doubles the voltage drop without adding the parasitic capacitance that would result by simply using two diodes in series. Also, this configuration increases the collector-to-base voltage of transistor Q4, which permits the use of a smaller transistor, further reducing stray capacitance and increasing the slew rate.

In this embodiment of the present invention, the base of transistor Q3, rather than being fixed as shown in FIG. 1, is bootstrapped by the output voltage so that voltage stress on transistor Q3 is reduced, allowing a greater output swing for a given breakdown voltage. The feedback resistor 14 is replaced by resistors 14-1 and 14-2 connected in series. An emitter follower transistor Q6 has the base thereof connected to the junction of resistors 14-1 and 14-2, and the emitter thereof is connected to the base of transistor Q3. The emitter of transistor Q6 is also connected to an appropriate biasing network comprising a resistor 28 and a suitable voltage source 30. The values of resistors 14-1 and 14-2 may be chosen to provide an appropriate division of the output signal to drive the base of transistor Q6, and hence the base of transistor of Q3 to provide the proper bootstrapping action. The bootstrapping technique herein described not only reduces the voltage stress on the transistor Q3, but also improves the closed loop gain by compensating for beta losses of the three-terminal composite transistor Q1. The feedback network is loaded by a factor beta multiplied by the value of resistor 28, wherein beta is the well-known current gain factor of a transistor. Thus, as beta is decreased, the feedback is reduced, increasing the closed loop gain. The value of resistor 28 is chosen to use this effect to compensate for the loss of open loop gain with decreasing beta, resulting in an amplifier the gain of which can be made nearly independent of beta or can be made to increase with decreasing beta to compensate for other circuitry.

The preferred embodiment shown in FIG. 2 is particularly suitable for realization in monolithic integrated-circuit form. Replacing transistors Q1 and Q2 with three-terminal composite transistors as taught by Carl R. Battjes in U.S. Pat. No. 4,236,119, improves the high frequency response and also improves the open loop gain of the feedback amplifier because the base current at the input is reduced since the control current is shared by transistors Q1B and Q1A. Also, the slew rate is improved because the base current of transistor Q2B is reduced similarly. Because transistor Q2B conducts less current, it can be reduced in size, which also contributes to an improved slew rate. The area ratio of transistor Q1A to Q1C and Q2A and Q2C determine the current split in these three-terminal composite transistors. For an area ratio of 1:1, base current is cut in half. Similarly, for higher ratios the base current is reduced even further. The ratio chosen is a compromise between high open loop gain (large ratio) and high frequency stability (small ratio, approaching unity).

While I have shown and described the preferred embodiments of my invention, it will be apparent to those skilled in the art that many changes and modifications may be made without departing from my invention in its broader aspects. For example, a diode could be added in parallel with resistor 16 (oriented with the cathode connected to transistor Q3 collector) to improve circuit operation under pull-down conditions by providing a current-conduction path and at the same time limiting the voltage excursion at the emitter of transistor Q4. Therefore, the scope of the invention should be determined only by the following claims.

What I claim as being novel is:

1. A shunt feedback amplifier, comprising:

a control stage comprising in combination a common-emitter amplifier and a common-base amplifier connected in cascode, the base of said common-emitter amplifier connectable to an input signal source and the collector of said common-base amplifier coupled to an output terminal;

a feedback path connected from said output terminal to the base of said common-emitter amplifier;

an emitter-follower stage the base of which is coupled to the collector of said common-base amplifier and the emitter of which is coupled to said output terminal;

bias means for controlling said emitter follower stage in such a manner that said emitter follower stage provides a current conduction path to develop an output signal in response to an input signal of a first polarity while maintaining a voltage difference equal to zero volts between the collector of said common-base amplifier and the emitter of said emitter follower stage, said bias means further providing a voltage difference between said collector of said common-base amplifier and the emitter of said emitter follower stage sufficient to reverse bias said emitter follower stage in response to an input signal of a second polarity; and bootstrap means for maintaining a substantially constant collector-to-emitter voltage for said emitter follower stage.

2. A shunt feedback amplifier in accordance with claim 1 wherein said common-emitter amplifier and said emitter follower stage comprise three-terminal composite transistor devices, each consisting of first, second, and third transistors, wherein the base of said first transistor provides a first terminal, the collectors of said first and second transistors are connected together to provide a second terminal, the emitters of said second and third transistors are connected together to provide a third termnal, and the emitter of said first transistor, the base of said second transistor, and the base and collector of said third transistor are connected together.

3. A shunt feedback amplifier in accordance with claim 1 further including means for providing at least a portion of said output signal to the base of said common-base amplifier.

4. A shunt feedback amplifier in accordance with claim 3 wherein said signal providing means comprises an emitter follower transistor the base of which is coupled to receive a predetermined proportion of voltage from said feedback path, and the emitter of which is coupled to the base of said common-base amplifier.

5. A shunt feedback amplifier in accordance with claim 4 wherein said emitter of said emitter-follower transistor is connected through a resistor to a predetermined bias voltage.

* * * * *